US007925222B2

(12) United States Patent
Rofougaran et al.

(10) Patent No.: US 7,925,222 B2
(45) Date of Patent: *Apr. 12, 2011

(54) METHOD AND SYSTEM FOR SIMULTANEOUS FM TRANSMISSION AND FM RECEPTION USING A SHARED ANTENNA AND A DIRECT DIGITAL FREQUENCY SYNTHESIZER

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 857 days.

This patent is subject to a terminal disclaimer.

(21) Appl. No.: 11/754,581

(22) Filed: May 29, 2007

(65) Prior Publication Data

US 2008/0233889 A1 Sep. 25, 2008

Related U.S. Application Data

(60) Provisional application No. 60/895,698, filed on Mar. 19, 2007.

(51) Int. Cl.
*H04B 1/40* (2006.01)

(52) U.S. Cl. .......... 455/76; 455/41.1; 455/41.2; 455/73; 455/75; 455/205; 455/112; 455/313; 455/258; 455/101; 455/185.1; 331/40; 331/25; 331/37; 341/126; 340/10.1; 343/850; 343/909; 330/51; 330/261; 330/278; 330/253

(58) Field of Classification Search .................. 455/11.1, 455/41.1, 41.2, 73, 76, 185.1, 205, 313, 112, 455/142, 101, 258; 330/51, 261, 278, 253; 375/295, 355, 219; 340/10.1; 343/850, 909; 331/40, 25, 37; 341/126
See application file for complete search history.

(56) References Cited

U.S. PATENT DOCUMENTS

| | | | | |
|---|---|---|---|---|
| 6,960,962 | B2 * | 11/2005 | Peterzell et al. | 331/40 |
| 7,548,742 | B2 * | 6/2009 | Johnson | 455/313 |
| 7,554,404 | B2 * | 6/2009 | Roufoogaran | 330/261 |
| 7,564,302 | B2 * | 7/2009 | Zolfaghari | 330/51 |
| 2005/0090208 | A1 * | 4/2005 | Liao | 455/112 |
| 2008/0231366 | A1 * | 9/2008 | Roufoogaran | 330/261 |
| 2008/0231422 | A1 * | 9/2008 | Rofougaran et al. | 340/10.1 |
| 2008/0231535 | A1 * | 9/2008 | Rofougaran et al. | 343/850 |
| 2008/0231536 | A1 * | 9/2008 | Rofougaran et al. | 343/850 |
| 2008/0231537 | A1 * | 9/2008 | Rofougaran et al. | 343/850 |
| 2008/0231543 | A1 * | 9/2008 | Rofougaran et al. | 343/909 |
| 2008/0232448 | A1 * | 9/2008 | Baker | 375/219 |
| 2008/0232507 | A1 * | 9/2008 | Rofougaran et al. | 375/295 |
| 2008/0232522 | A1 * | 9/2008 | Rofougaran et al. | 375/355 |
| 2008/0233864 | A1 * | 9/2008 | Rofougaran et al. | 455/11.1 |
| 2008/0233867 | A1 * | 9/2008 | Rofougaran et al. | 455/41.1 |
| 2008/0233868 | A1 * | 9/2008 | Rofougaran et al. | 455/41.1 |
| 2008/0233869 | A1 * | 9/2008 | Baker et al. | 455/41.1 |
| 2008/0233870 | A1 * | 9/2008 | Budde | 455/41.2 |

(Continued)

*Primary Examiner* — Matthew D Anderson
*Assistant Examiner* — April G Gonzales
(74) *Attorney, Agent, or Firm* — McAndrews, Held & Malloy, Ltd.

(57) ABSTRACT

Certain aspects of a method and system for simultaneous FM transmission and FM reception using a shared antenna and a direct digital frequency synthesizer (DDFS) may be disclosed. In a FM transceiver that receives FM signals at a frequency $f_1$ and transmits FM signals at a frequency $f_2$, aspects of the method may include generating via a DDFS, a signal corresponding to a difference between $f_1$ and $f_2$ to enable simultaneous transmission and reception of FM signals via shared antenna.

22 Claims, 9 Drawing Sheets

U.S. PATENT DOCUMENTS

| | | | |
|---|---|---|---|
| 2008/0233871 A1* | 9/2008 | Rofougaran et al. | 455/41.2 |
| 2008/0233880 A1* | 9/2008 | Rofougaran et al. | 455/42 |
| 2008/0233889 A1* | 9/2008 | Rofougaran et al. | 455/73 |
| 2008/0233891 A1* | 9/2008 | Rofougaran et al. | 455/76 |
| 2008/0233908 A1* | 9/2008 | Rofougaran et al. | 455/185.1 |
| 2008/0233910 A1* | 9/2008 | Rofougaran et al. | 455/205 |
| 2009/0251210 A1* | 10/2009 | Zolfaghari | 330/51 |
| 2009/0289870 A1* | 11/2009 | Rofougaran et al. | 343/850 |

\* cited by examiner

METHOD AND SYSTEM FOR SIMULTANEOUS FM TRANSMISSION AND FM RECEPTION USING A SHARED ANTENNA AND A DIRECT DIGITAL FREQUENCY SYNTHESIZER

CROSS-REFERENCE TO RELATED APPLICATIONS/INCORPORATION BY REFERENCE

This application makes reference to, claims priority to, and claims benefit of U.S. Provisional Application Ser. No. 60/895,698 filed Mar. 19, 2007.

This application also makes reference to:
U.S. patent application Ser. No. 11/754,481 filed May 29, 2007;
U.S. patent application Ser. No. 11/754,460 filed May 29, 2007;
U.S. patent application Ser. No. 11/754,621 filed May 29, 2007;
U.S. patent application Ser. No. 11/754,490 filed May 29, 2007;
U.S. patent application Ser. No. 11/754,708 filed May 29, 2007;
U.S. patent application Ser. No. 11/754,768 filed May 29, 2007;
U.S. patent application Ser. No. 11/754,705 filed May 29, 2007;
U.S. patent application Ser. No. 11/754,600 filed May 29, 2007;
U.S. patent application Ser. No. 11/754,407 filed May 29, 2007; and
U.S. patent application Ser. No. 11/754,438 filed May 29, 2007.

Each of the above stated applications is hereby incorporated herein by reference in its entirety.

FIELD OF THE INVENTION

Certain embodiments of the invention relate to multi-standard systems. More specifically, certain embodiments of the invention relate to a method and system for simultaneous FM transmission and FM reception using a shared antenna and a direct digital frequency synthesizer (DDFS).

BACKGROUND OF THE INVENTION

A direct digital frequency synthesizer (DDFS) is a digitally-controlled signal generator that may vary the output signal frequency over a large range of frequencies, based on a single fixed-frequency precision reference clock. In addition, a DDFS is also phase-tunable. In essence, within the DDFS, discrete amplitude levels are input to a digital-to-analog converter (DAC) at a sampling rate determined by the fixed-frequency reference clock. The output of the DDFS may provide a signal whose shape may depend on the sequence of discrete amplitude levels that are input to the DAC at the constant sampling rate. The DDFS is particularly well suited as a frequency generator that outputs a sine or other periodic waveforms over a large range of frequencies, from almost DC to approximately half the fixed-frequency reference clock frequency.

A DDFS offers a larger range of operating frequencies and requires no feedback loop, thereby providing near instantaneous phase and frequency changes, avoiding overshooting, undershooting and settling time issues associated with other analog systems. A DDFS may provide precise digitally-controlled frequency and/or phase changes without signal discontinuities.

With the popularity of portable electronic devices and wireless devices that support audio applications, there is a growing need to provide a simple and complete solution for audio communications applications. For example, some users may utilize Bluetooth-enabled devices, such as headphones and/or speakers, to allow them to communicate audio data with their wireless handset while freeing to perform other activities. Other users may have portable electronic devices that may enable them to play stored audio content and/or receive audio content via broadcast communication, for example.

However, integrating multiple audio communication technologies into a single device may be costly. Combining a plurality of different communication services into a portable electronic device or a wireless device may require separate processing hardware and/or separate processing software. Moreover, coordinating the reception and/or transmission of data to and/or from the portable electronic device or a wireless device that uses FM transceivers may require significant processing overhead that may impose certain operation restrictions and/or design challenges.

Furthermore, simultaneous use of a plurality of radios in a handheld may result in significant increases in power consumption. Power being a precious commodity in most wireless mobile devices, combining devices such as a Bluetooth radio and a FM radio requires careful design and implementation in order to minimize battery usage. Additional overhead such as sophisticated power monitoring and power management techniques are required in order to maximize battery life.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for simultaneous FM transmission and FM reception using a shared antenna and a direct digital frequency synthesizer (DDFS), substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for simultaneous FM transmission and FM reception using a shared antenna and a DDFS. In a FM transceiver that receives FM signals at a frequency $f_1$ and transmits FM signals at a frequency $f_2$, aspects of the method may comprise generating via a DDFS, a signal corresponding to a difference between $f_1$ and $f_2$ to enable simultaneous transmission and reception of FM signals via shared antenna.

Figure 1A:
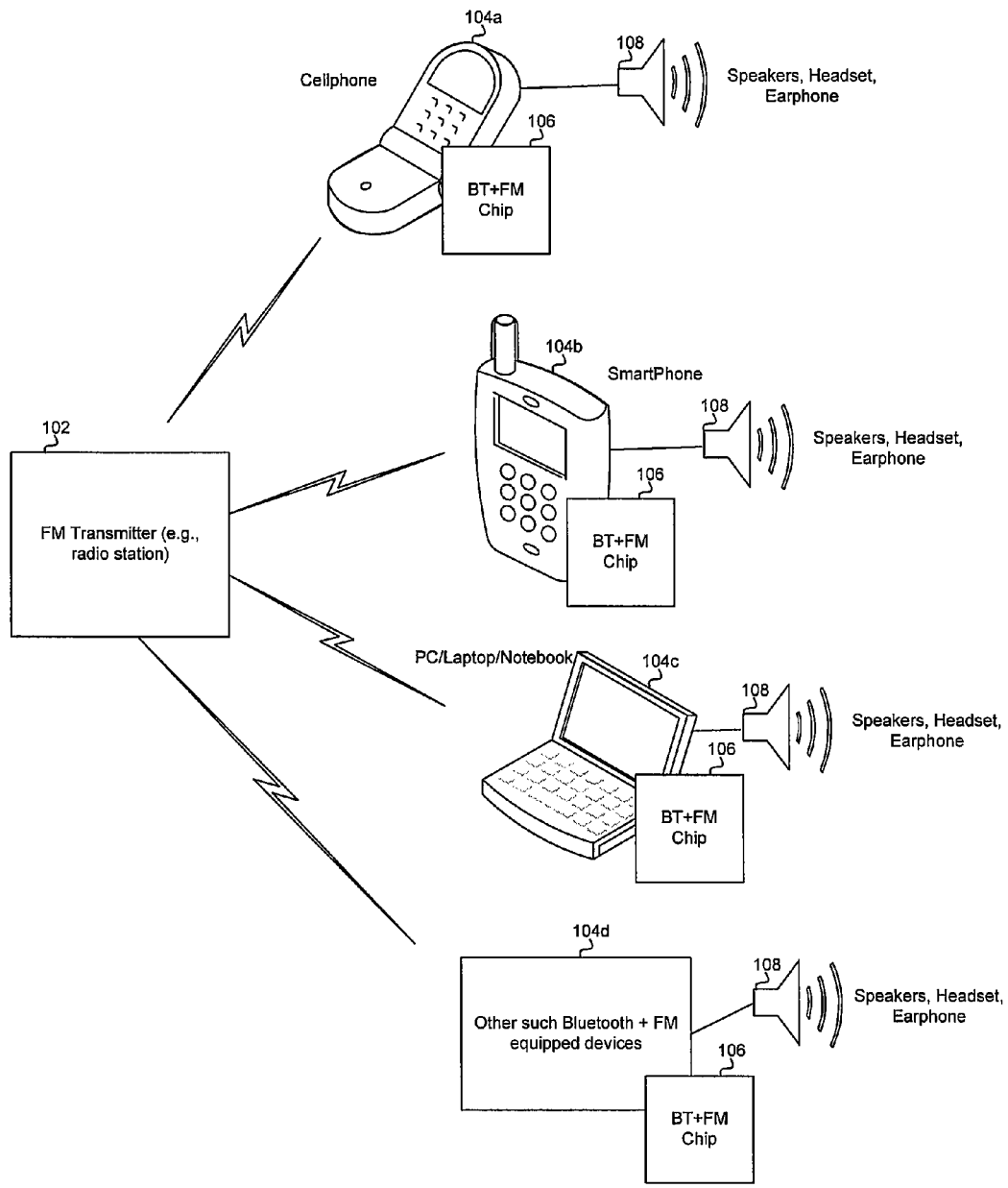
FIG. 1A is a block diagram of an exemplary FM transmitter that communicates with handheld devices that utilize a single chip with integrated Bluetooth and FM radios, in accordance with an embodiment of the invention.

FIG. 1A is a block diagram of an exemplary FM transmitter that communicates with handheld devices that utilize a single chip with integrated Bluetooth and FM radios, in accordance with an embodiment of the invention. Referring to FIG. 1A, there is shown an FM transmitter 102, a cellular phone 104a, a smart phone 104b, a computer 104c, and an exemplary FM and Bluetooth-equipped device 104d. The FM transmitter 102 may be implemented as part of a radio station or other broadcasting device, for example. Each of the cellular phone 104a, the smart phone 104b, the computer 104c, and the exemplary FM and Bluetooth-equipped device 104d may comprise a single chip 106 with integrated Bluetooth and FM radios for supporting FM and Bluetooth data communications. The FM transmitter 102 may enable communication of FM audio data to the devices shown in FIG. 1A by utilizing the single chip 106. Each of the devices in FIG. 1A may comprise and/or may be communicatively coupled to a listening device 108 such as a speaker, a headset, or an earphone, for example.

The cellular phone 104a may be enabled to receive an FM transmission signal from the FM transmitter 102. The user of the cellular phone 104a may then listen to the transmission via the listening device 108. The cellular phone 104a may comprise a "one-touch" programming feature that enables pulling up specifically desired broadcasts, like weather, sports, stock quotes, or news, for example. The smart phone 104b may be enabled to receive an FM transmission signal from the FM transmitter 102. The user of the smart phone 104b may then listen to the transmission via the listening device 108.

The computer 104c may be a desktop, laptop, notebook, tablet, and a PDA, for example. The computer 104c may be enabled to receive an FM transmission signal from the FM transmitter 102. The user of the computer 104c may then listen to the transmission via the listening device 108. The computer 104c may comprise software menus that configure listening options and enable quick access to favorite options, for example. In one embodiment of the invention, the computer 104c may utilize an atomic clock FM signal for precise timing applications, such as scientific applications, for example. While a cellular phone, a smart phone, computing devices, and other devices have been shown in FIG. 1A, the single chip 106 may be utilized in a plurality of other devices and/or systems that receive and use Bluetooth and/or FM signals.

A clock signal $f_{LO}$ may be generated at a particular frequency in the single chip 106 that handles communication of Bluetooth signals and FM signals. The generated clock signal $f_{LO}$ may be utilized for clocking one or more direct digital frequency synthesizers (DDFSs) to enable transmission of the FM signals.

Figure 1B:
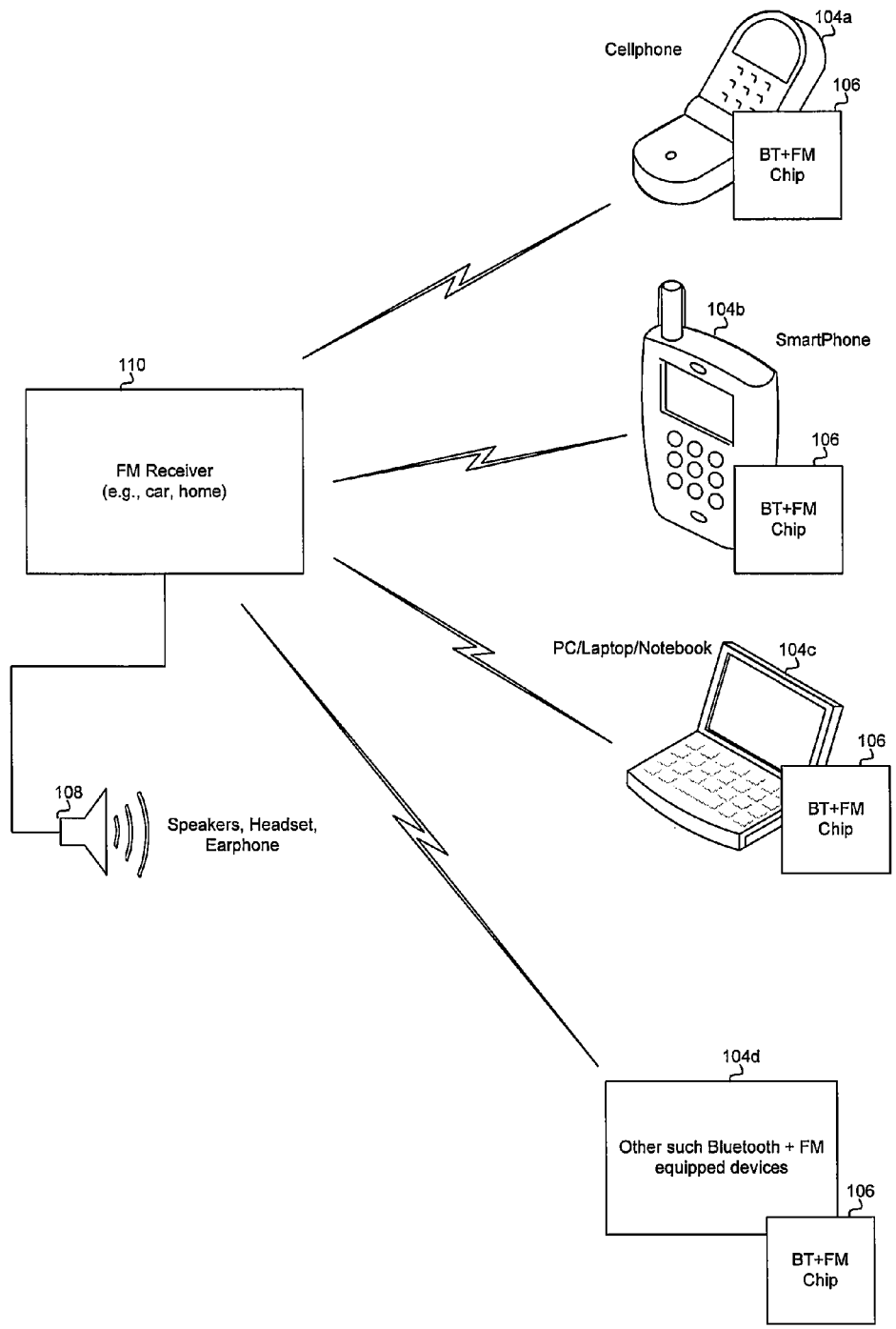
FIG. 1B is a block diagram of an exemplary FM receiver that communicates with handheld devices that utilize a single chip with integrated Bluetooth and FM radios, in accordance with an embodiment of the invention.

FIG. 1B is a block diagram of an exemplary FM receiver that communicates with handheld devices that utilize a single chip with integrated Bluetooth and FM radios, in accordance with an embodiment of the invention. Referring to FIG. 1B, there is shown an FM receiver 110, the cellular phone 104a, the smart phone 104b, the computer 104c, and the exemplary FM and Bluetooth-equipped device 104d. In this regard, the FM receiver 110 may comprise and/or may be communicatively coupled to a listening device 108. A device equipped with the Bluetooth and FM transceivers, such as the single chip 106, may be able to broadcast its respective signal to a "deadband" of an FM receiver for use by the associated audio system. For example, a cellphone or a smart phone, such as the cellular phone 104a and the smart phone 104b, may transmit a telephone call for listening over the audio system of an automobile, via usage of a deadband area of the car's FM stereo system. One advantage may be the universal ability to use this feature with all automobiles equipped simply with an FM radio with few, if any, other external FM transmission devices or connections being required.

In another example, a computer, such as the computer 104c, may comprise an MP3 player or another digital music format player and may broadcast a signal to the deadband of an FM receiver in a home stereo system. The music on the computer may then be listened to on a standard FM receiver with few, if any, other external FM transmission devices or connections. While a cellular phone, a smart phone, and computing devices have been shown, a single chip that combines a Bluetooth and FM transceiver and/or receiver may be utilized in a plurality of other devices and/or systems that receive and use an FM signal.

A clock signal $f_{LO}$ may be generated at a particular frequency in the single chip 106 that handles communication of Bluetooth signals and FM signals. The generated clock signal $f_{LO}$ may be utilized for clocking one or more direct digital frequency synthesizers (DDFSs) to enable reception of the FM signals.

Figure 1C:
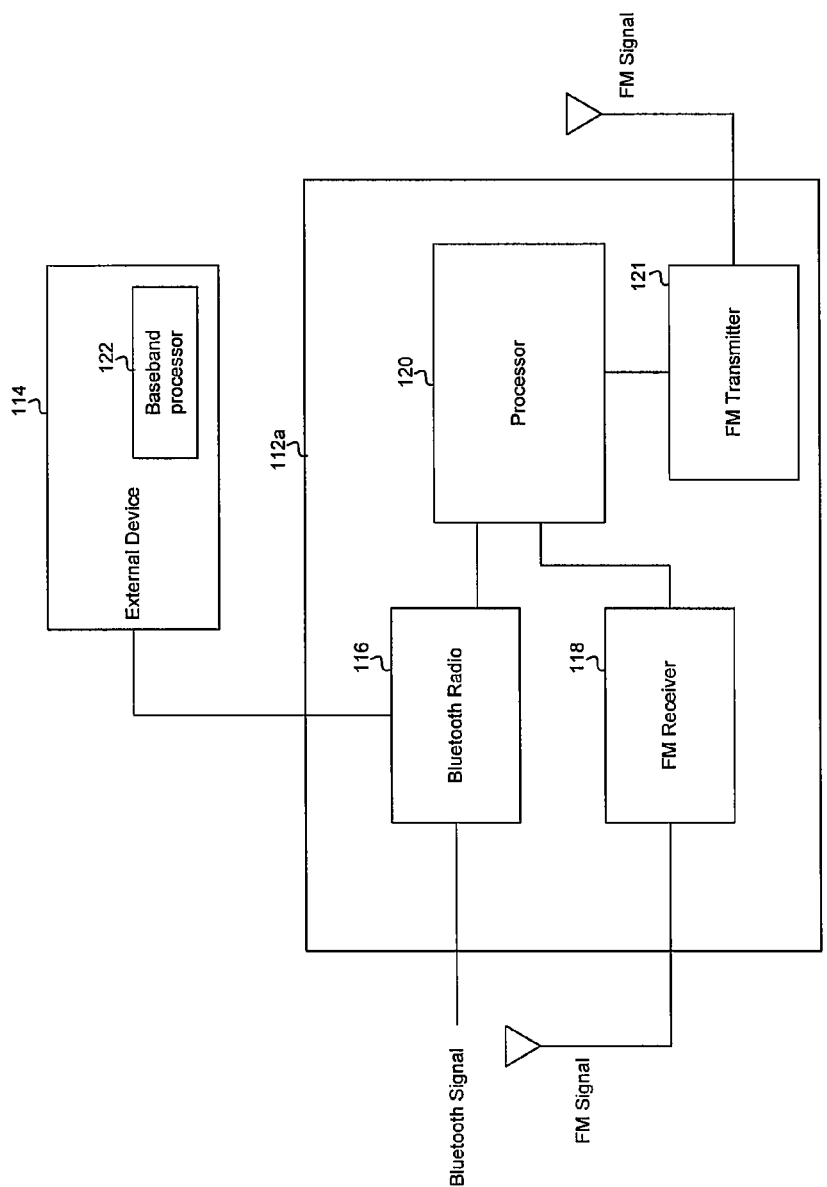
FIG. 1C is a block diagram of an exemplary single chip with integrated Bluetooth and FM radios that supports FM processing and an external device that supports Bluetooth processing, in accordance with an embodiment of the invention.

FIG. 1C is a block diagram of an exemplary single chip with integrated Bluetooth and FM radios that supports FM processing and an external device that supports Bluetooth processing, in accordance with an embodiment of the invention. Referring to FIG. 1C, there is shown a single chip 112a that supports Bluetooth and FM radio operations and an external device 114. The single chip 112a may comprise an integrated Bluetooth radio 116, an integrated FM receiver 118, an integrated FM transmitter 121 and an integrated processor 120. The Bluetooth radio 116 may comprise suitable logic, circuitry, and/or code that enable Bluetooth signal communication via the single chip 112a. In this regard, the Bluetooth radio 116 may support audio signals or communication. The FM receiver 118 may comprise suitable logic, circuitry, and/or code that enable FM signal communication via the single chip 112a.

The integrated processor 120 may comprise suitable logic, circuitry, and/or code that may enable processing of the FM data received by the FM receiver 118. Moreover, the integrated processor 120 may enable processing of FM data to be transmitted by the FM receiver 118 when the FM receiver 118 comprises transmission capabilities. The external device 114 may comprise a baseband processor 122. The baseband processor 122 may comprise suitable logic, circuitry, and/or code that may enable processing of Bluetooth data received by the Bluetooth radio 116. Moreover, the baseband processor 122 may enable processing of Bluetooth data to be transmitted by the Bluetooth radio 116. In this regard, the Bluetooth radio 116 may communicate with the baseband processor 122 via the external device 114. The Bluetooth radio 116 may communicate with the integrated processor 120. The FM transmitter 121 may comprise suitable logic, circuitry, and/or that may enable transmission of FM signals via appropriate broadcast channels, for example.

Figure 1D:
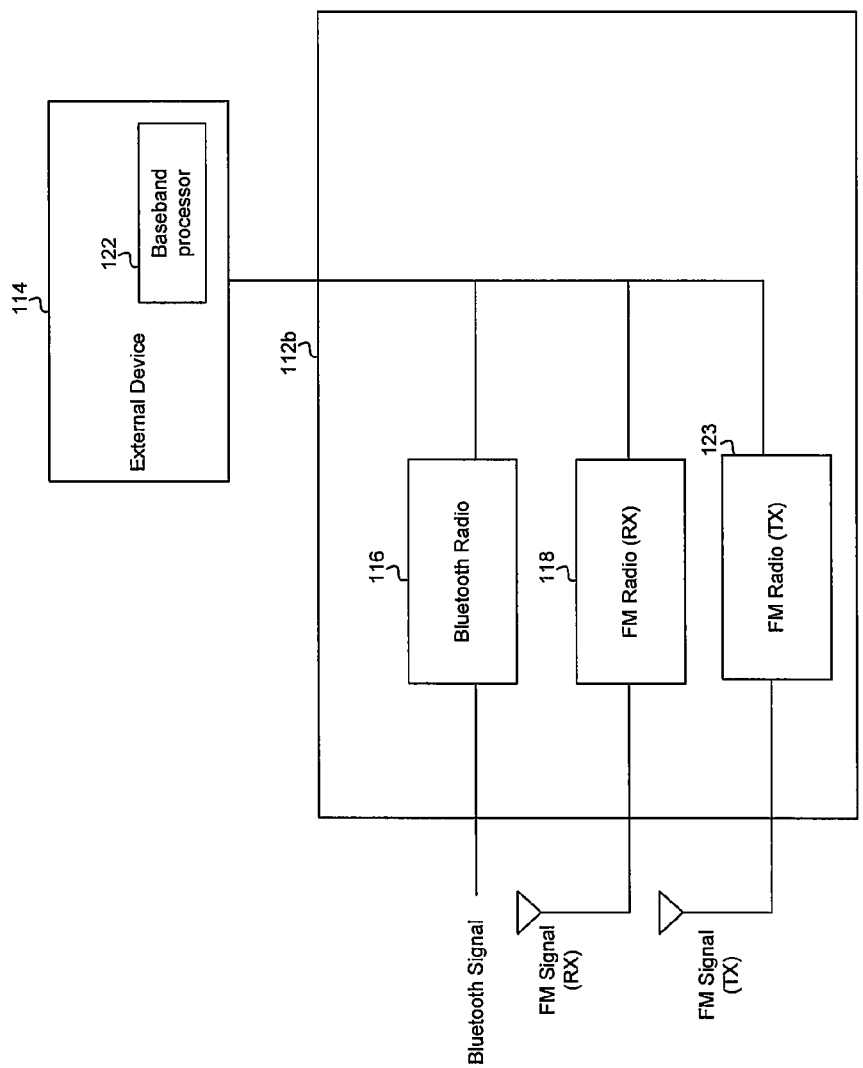
FIG. 1D is a block diagram of an exemplary single chip with integrated Bluetooth and FM radios and an external device that supports Bluetooth and FM processing, in accordance with an embodiment of the invention.

FIG. 1D is a block diagram of an exemplary single chip with integrated Bluetooth and FM radios and an external device that supports Bluetooth and FM processing, in accordance with an embodiment of the invention. Referring to FIG. 1D, there is shown a single chip 112b that supports Bluetooth and FM radio operations and an external device 114. The single chip 112b may comprise the Bluetooth radio 116, FM reception radio 118, and FM transmission radio 123. The Bluetooth radio 116, the FM reception radio 118 and FM transmission radio 123 may be integrated into the single chip 112b. The external device 114 may comprise a baseband processor 122. The baseband processor 122 may comprise suitable logic, circuitry, and/or code that may enable processing of Bluetooth data received by the Bluetooth radio 116 and/or processing of Bluetooth data to be transmitted by the Bluetooth radio 116. In this regard, the Bluetooth radio 116 may communicate with the baseband processor 122 via the external device 114. Moreover, the baseband processor 122 may comprise suitable logic, circuitry, and/or code that may enable processing of the FM data received by the FM reception radio 118. The baseband processor 122 may enable processing FM data to be transmitted by the FM transmission radio 123. In this regard, the FM reception radio 118 and the FM transmission radio 123 may communicate with the baseband processor 122 via the external device 114.

Figure 1E:
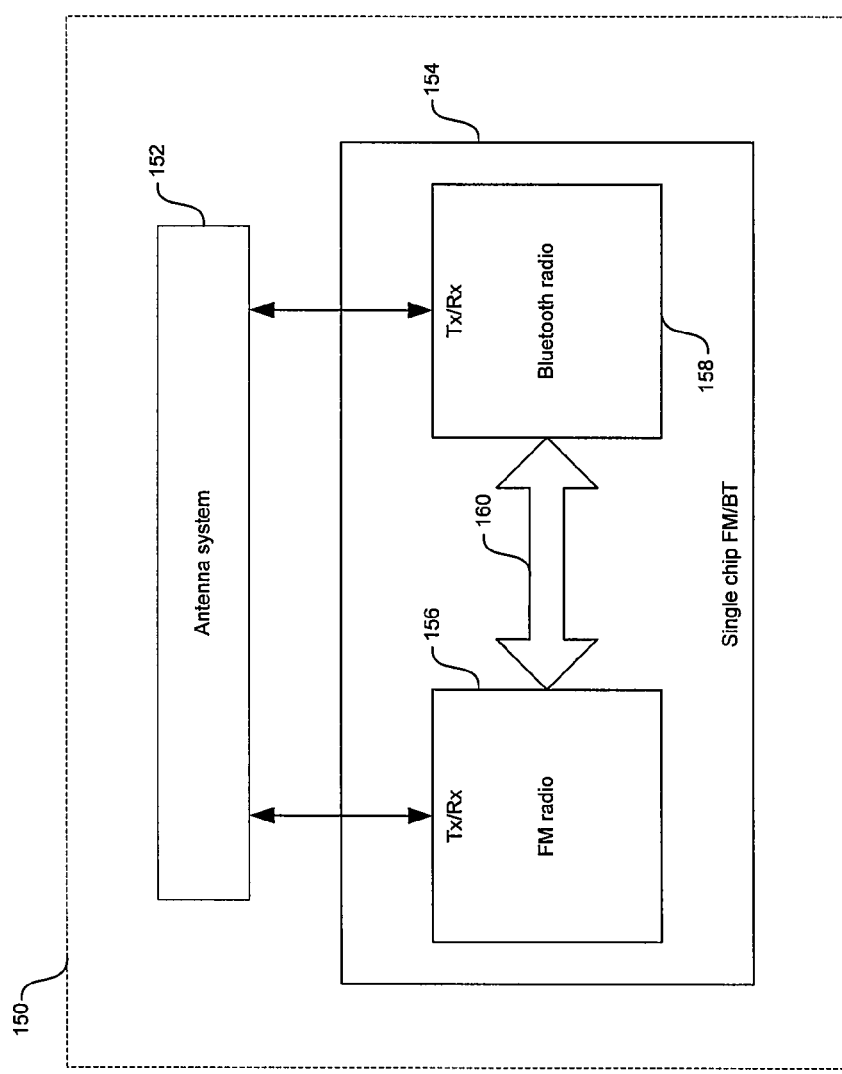
FIG. 1E is a block diagram that illustrates an exemplary single integrated circuit (IC) that supports FM and Bluetooth radio operations, in accordance with an embodiment of the invention.

FIG. 1E is a block diagram that illustrates an exemplary single radio chip that supports FM and Bluetooth radio operations, in accordance with an embodiment of the invention. Referring to FIG. 1F, there is shown a mobile phone 150 that may comprise a FM/Bluetooth coexistence antenna system 152 and a single chip FM/Bluetooth (FM/BT) radio device 154. The single chip FM/BT radio device 154 may comprise a FM radio portion 156 and a Bluetooth radio portion 158. The single chip FM/BT radio device 154 may be implemented based on a system-on-chip (SOC) architecture, for example.

The FM/Bluetooth coexistence antenna system 152 may comprise suitable hardware, logic, and/or circuitry that may be enabled to provide FM and Bluetooth communication between external devices and a coexistence terminal. The FM/Bluetooth coexistence antenna system 152 may comprise at least one antenna for the transmission and reception of FM and Bluetooth packet traffic.

The FM radio portion 156 may comprise suitable logic, circuitry, and/or code that may be enabled to process FM packets for communication. The FM radio portion 156 may be enabled to transfer and/or receive FM packets and/or information to the FM/Bluetooth coexistence antenna system 152 via a single transmit/receive (Tx/Rx) port. In some instances, the transmit port (Tx) may be implemented separately from the receive port (Rx). The FM radio portion 156 may also be enabled to generate signals that control at least a portion of the operation of the FM/Bluetooth coexistence antenna system 152. Firmware operating in the FM radio portion 156 may be utilized to schedule and/or control FM packet communication, for example.

The FM radio portion 156 may also be enabled to receive and/or transmit priority signals 160. The priority signals 160 may be utilized to schedule and/or control the collaborative operation of the FM radio portion 156 and the Bluetooth radio portion 158. The Bluetooth radio portion 158 may comprise suitable logic, circuitry, and/or code that may be enabled to process Bluetooth protocol packets for communication. The Bluetooth radio portion 158 may be enabled to transfer and/or receive Bluetooth protocol packets and/or information to the FM/Bluetooth coexistence antenna system 152 via a single transmit/receive (Tx/Rx) port. In some instances, the transmit port (Tx) may be implemented separately from the receive port (Rx). The Bluetooth radio portion 158 may also be enabled to generate signals that control at least a portion of the operation of the FM/Bluetooth coexistence antenna system 152. Firmware operating in the Bluetooth radio portion 158 may be utilized to schedule and/or control Bluetooth packet communication. The Bluetooth radio portion 158 may also be enabled to receive and/or transmit priority signals 160. A portion of the operations supported by the FM radio portion 156 and a portion of the operations supported by the Bluetooth radio portion 158 may be performed by common logic, circuitry, and/or code.

In some instances, at least a portion of either the FM radio portion 156 or the Bluetooth radio portion 158 may be disabled and the wireless terminal may operate in a single-communication mode, that is, coexistence may be disabled. When at least a portion of the FM radio portion 156 is disabled, the FM/Bluetooth coexistence antenna system 152 may utilize a default configuration to support Bluetooth communication. When at least a portion of the Bluetooth radio portion 158 is disabled, the FM/Bluetooth coexistence antenna system 152 may utilize a default configuration to support FM communication.

Figure 2A:
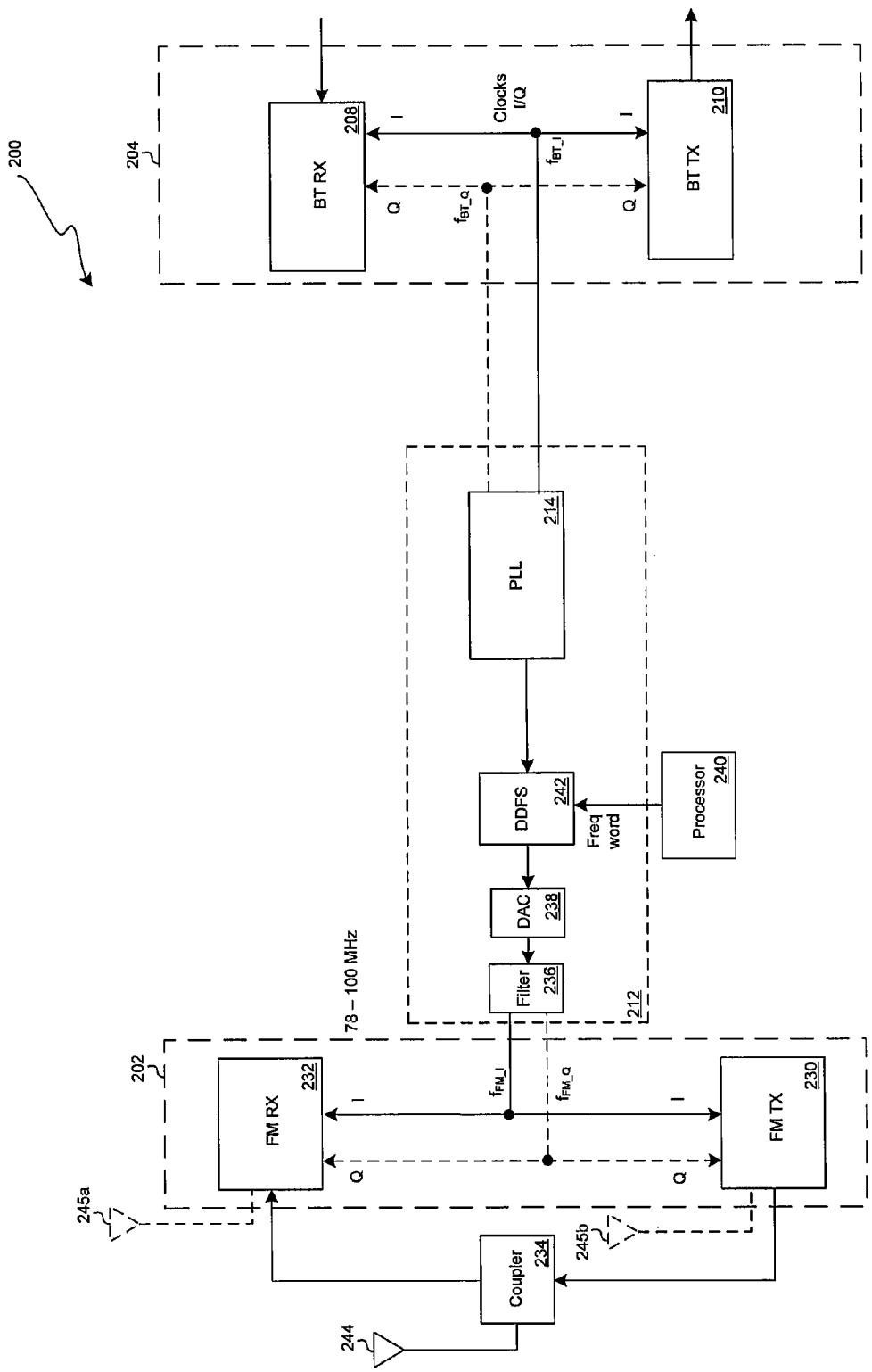
FIG. 2A is a block diagram illustrating an exemplary integration of Bluetooth and FM local oscillator generation in a single unit using a direct digital frequency synthesizer (DDFS), in accordance with an embodiment of the invention.

FIG. 2A is a block diagram illustrating an exemplary integration of Bluetooth and FM local oscillator generation in a single unit using a direct digital frequency synthesizer (DDFS), in accordance with an embodiment of the invention. Referring to FIG. 2A, there is shown a communication system 200. The communication system 200 comprises a FM transceiver 202, a Bluetooth transceiver 204, a processor 240, a local oscillator generation unit (LOGEN) 212, and a coupler 234 coupled to an antenna 244. The FM transceiver 202 may comprise a FM receiver 232 and a FM transmitter 230. The Bluetooth transceiver 204 may comprise a Bluetooth receiver 208 and a Bluetooth transmitter 210. The LOGEN 212 may comprise a filter 236, a digital to analog converter (DAC) 238 a direct digital frequency synthesizer (DDFS) 242, and a phase locked loop (PLL) 214.

The LOGEN 212 may comprise suitable logic, circuitry, and/or code that may be enabled to generate a Bluetooth clock signal $f_{BT}$ comprising an in-phase (I) component $f_{BT\_I}$ and a quadrature-phase (Q) component $f_{BT\_Q}$. The I component and Q component signals may be communicated to the Bluetooth receiver 208 and the Bluetooth transmitter 210. The frequency of the generated Bluetooth clock signal $f_{BT}$ to the Bluetooth receiver 208 and the Bluetooth transmitter 210 may be about 2.4 GHz, for example, and may be enabled to clock one or more of the Bluetooth receiver 208 and the Bluetooth transmitter 210. The LOGEN 212 may also be enabled to generate an I component and a Q component output signal, $f_{FM\_I}$ and $f_{FM\_Q}$ respectively to the FM transceiver 202. The I and Q component signals, $f_{FM\_I}$ and $f_{FM\_Q}$ respectively may be communicated to the FM receiver 232 and the FM transmitter 230. The frequency of the generated FM clock signal $f_{FM}$ to the FM receiver 232 and the FM transmitter 230 may be about 78-100 MHz, for example, and may be enabled to clock one or more of the FM receiver 232 and the FM transmitter 230.

The PLL 214 may comprise suitable logic, circuitry, and/or code that may be enabled to be utilized as frequency modulation (FM) demodulators, or carrier recovery circuits, or as frequency synthesizers for modulation and demodulation. The output of the PLL 214 may have a phase noise characteristic similar to that of the DDFS 242, but may operate at a higher frequency.

The PLL 214 may be enabled to generate a Bluetooth clock signal $f_{BT}$ comprising an in-phase (I) component $f_{BT\_I}$ and a quadrature-phase (Q) component $f_{BT\_Q}$. The I component and Q component signals may be communicated to the Bluetooth receiver 208 and the Bluetooth transmitter 210. In accordance with an exemplary embodiment of the invention, the PLL 214 may be enabled to clock the DDFS 242 at a particular frequency, for example, at 1 GHz.

The DAC 238 may comprise suitable logic, circuitry and/or code that may enable generation of an analog output signal based on a received sequence of input binary numbers. The DAC 238 may be enabled to generate a corresponding analog voltage level for each input binary number. The number of distinct analog voltage levels may be equal to the number of distinct binary numbers in the input sequence.

The filter 238 may comprise suitable logic, circuitry and/or code that may enable low pass filtering (LPF) of signal components contained in a received input signal. The filter 238 may enable smoothing of the received input signal to attenuate amplitudes for undesirable frequency components contained in the received input signal. The filter 238 may generate a signal, $f_{FM}$, having a frequency in the FM frequency band. In an exemplary embodiment of the invention, the range of frequencies for the signal $f_{FM}$ may be between about 78 MHz and 100 MHz, for example. The signal $f_{FM}$ may be a quadrature signal comprising I and Q signal components, $f_{FM\_I}$ and $f_{FM\_Q}$ respectively. The 78-100 MHz I and Q signals may be communicated to an FM transmitter 230 and/or an FM receiver 232.

In an exemplary embodiment of the invention, the FM transmitter 230 and the FM receiver 232 may be coupled to an antenna 244 via a bidirectional coupler 234. The bidirectional coupler 234 may couple the antenna to the FM receiver 232 at a given time instant, such that the FM receiver 232 signal may receive signals via the antenna 244. The bidirectional coupler 234 may couple the antenna to the FM transmitter 230 at a different time instant under the control of a different $f_{Word}$ to the DDFS 242, such that the FM transmitter 230 signal may transmit signals via the antenna 244. In another exemplary embodiment of the invention, the FM transmitter 230 may be coupled to a transmitting antenna 245b, while the FM receiver 232 may be coupled to a receiving antenna 245a.

In accordance with an embodiment of the invention, the value $f_{Word}$ may be selected to maintain an approximately constant frequency for the signal $f_{FM}$ despite changes that may occur in the signal $f_{LO}$, which may occur due to frequency hopping in the Bluetooth communication signal.

Figure 2B:
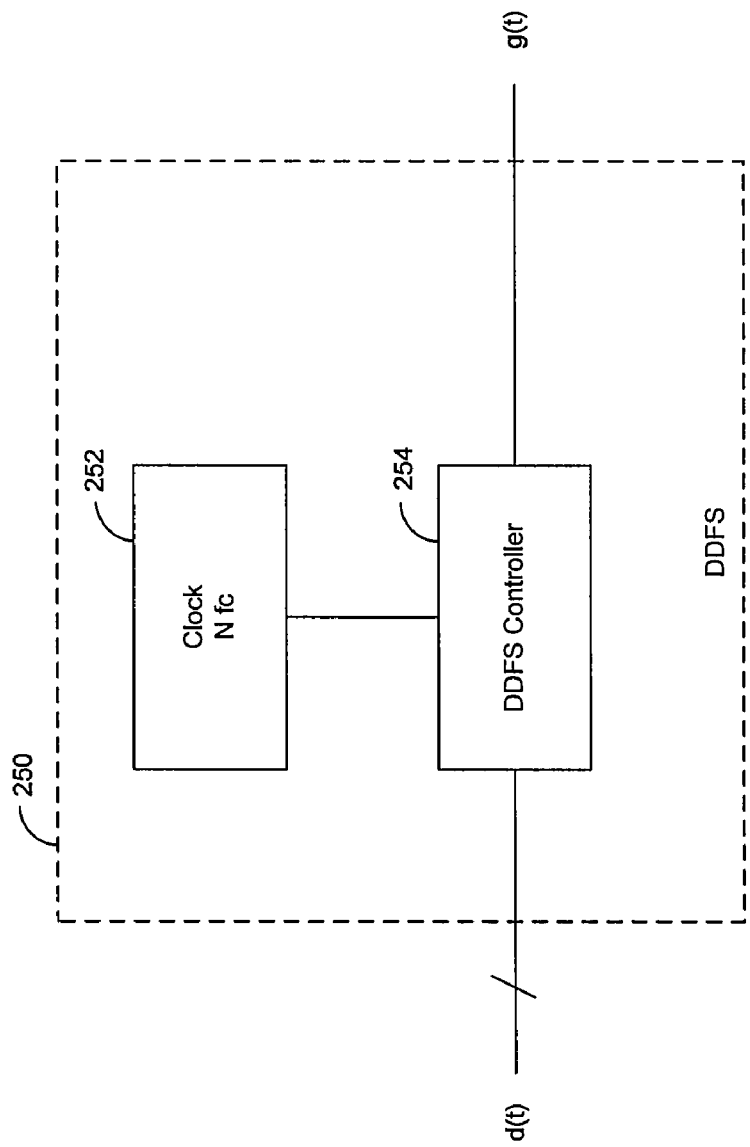
FIG. 2B is a block diagram illustrating an exemplary DDFS, in accordance with an embodiment of the invention.

FIG. 2B is a block diagram illustrating an exemplary direct digital frequency synthesizer (DDFS), in accordance with an embodiment of the invention. Referring to FIG. 2B, there is shown a DDFS 250, a clock 252 and a DDFS controller 254. The DDFS 250 may be a digitally-controlled signal generator that may vary the analog output signal g(t) over a large range of frequencies, based on a single fixed-frequency precision reference clock, for example, clock 252. Notwithstanding, the DDFS 250 may also be phase-tunable. The digital input signal d(t) may comprise control information regarding the frequency and/or phase of the analog output signal g(t) that may be generated as a function of the digital input signal d(t). The clock 252 may provide a reference clock that may be N times higher than the frequency fc of the generated output signal g(t). The DDFS controller 254 may generate a variable frequency analog output signal g(t) by utilizing the clock 252 and the digital input signal d(t).

Figure 3:
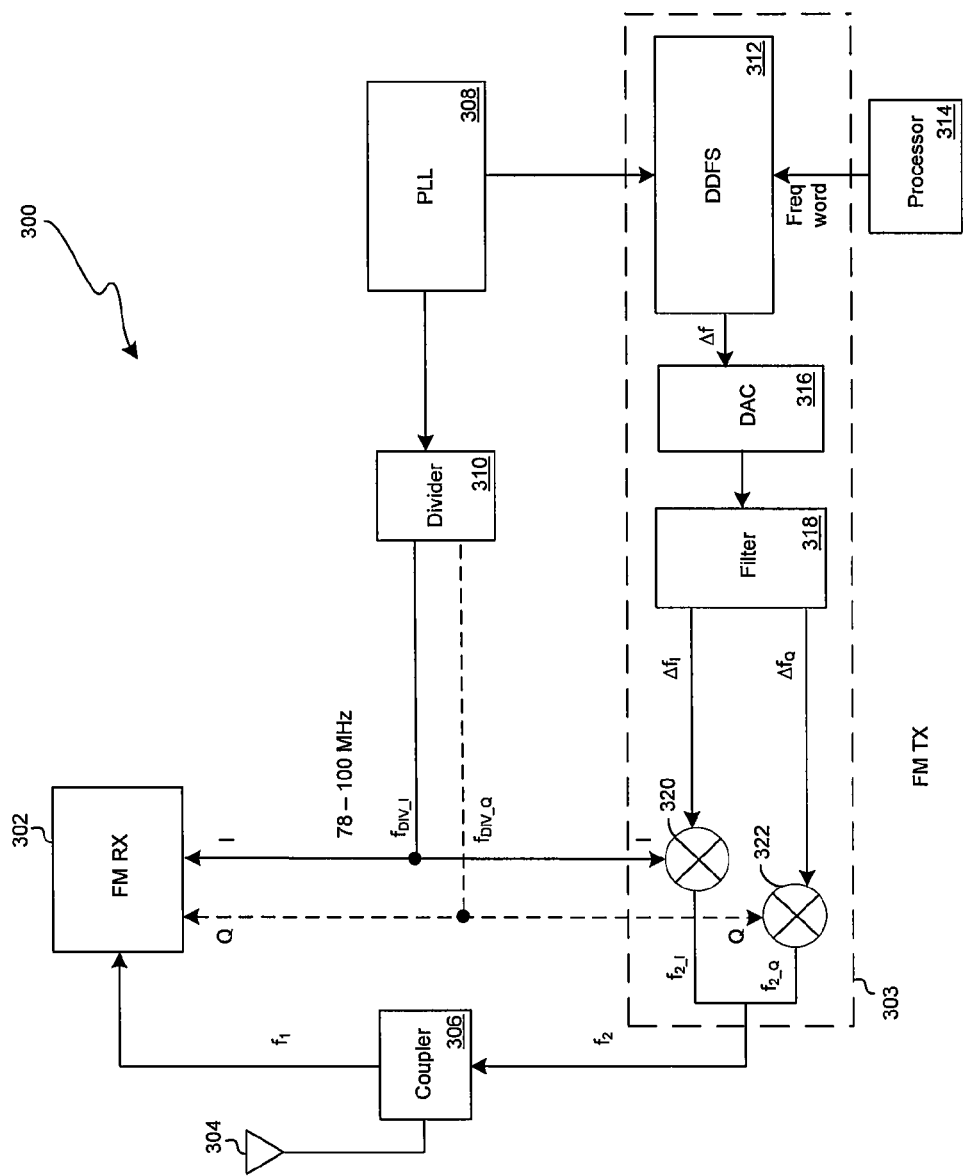
FIG. 3 is an exemplary block diagram of simultaneous FM transmission and FM reception using a shared antenna and a DDFS, in accordance with an embodiment of the invention.

FIG. 3 is an exemplary block diagram of simultaneous FM transmission and FM reception using a shared antenna and a DDFS, in accordance with an embodiment of the invention. Referring to FIG. 3, there is shown a FM communication system 300. The FM communication system 300 may comprise a FM receiver 302, a FM transmitter 303, a bi-directional coupler 306 coupled to an antenna 304, a PLL 308, a divider 310 and a processor 314.

The PLL 308 may comprise suitable logic, circuitry, and/or code that may be enabled to be generate a clock signal $f_{LO}$ at a particular frequency and may be utilized for frequency modulation/demodulation, or a carrier recovery circuit, or as a frequency synthesizer for modulation and demodulation. The output of the PLL 308 may have a phase noise characteristic similar to that of the DDFS 312, but may operate at a higher frequency. The PLL 308 may be enabled to clock the DDFS 312 at a particular frequency, for example, at 1 GHz.

The divider 310 may comprise suitable logic, circuitry, and/or code that may be enabled to divide a frequency of the generated clock signal $f_{LO}$ into one or more signals with different frequencies. For example, the divider 310 may be enabled to receive a 1 GHz input signal from the PLL 308 and generate a frequency divided clock signal, $f_{DIV}$. The frequency divided clock signal $f_{DIV}$ may have a frequency of about 78-100 MHZ, for example. In an embodiment of the invention, the frequency of the frequency divided clock signal $f_{DIV}$ may be equal to the frequency of the received FM signal $f_1$. The frequency divided clock signal $f_{DIV}$ may comprise an I component $f_{DIV\_I}$ and a Q component $f_{DIV\_Q}$. The I component $f_{DIV\_I}$ may be communicated to the FM receiver 302 and the mixer 320. The Q component $f_{DIV\_Q}$ may be communicated to the FM receiver 302 and the mixer 322.

In an embodiment of the invention, the clock signal $f_{LO}$ may be communicated to the DDFS 312. The DDFS 312 may comprise suitable logic, circuitry and/or code that may enable reception of the clock signal $f_{LO}$ and generate a sequence of binary numbers. The process of converting the clock signal $f_{LO}$ input signal to a sequence of binary numbers may comprise analog to digital conversion (ADC) whereby each distinct voltage, current and/or power level associated with the received clock signal, $f_{LO}$ may be represented as a binary number selected from a plurality of binary numbers. Conversely, each binary number may correspond to a range of voltage, current and/or power levels in the received clock signal $f_{LO}$. An exemplary clock signal, $f_{LO}$ may be a sinusoidal signal for which the corresponding period may be equal to the inverse of the frequency, $(1/f_{LO})$.

The number of binary numbers may be determined by the amount of bits, b, in the binary number representation. Each binary number may comprise a least significant bit (LSB) and a most significant bit (MSB). In an exemplary numerical representation, each of binary numbers may have a value within the range 0 to $2^b-1$. The operation of the DDFS 312 may be such that a period of the received clock signal, $f_{LO}$ may be converted to a binary sequence $0, 1, \ldots, 2^b-1$, wherein upon reaching the value $2^b-1$ the next number in the binary sequence may be 0 with the sequence continuing. The set of numbers from 0 to $2^b-1$ may represent a period of the binary sequence. The DDFS 312 may receive a frequency control word, $f_{word}$, from the processor 314 upon which the value of b may be determined. Consequently, the period of the sequence of binary numbers generated by the DDFS 314 may be programmable based on the $f_{word}$ input signal.

In accordance with an embodiment of the invention, the FM receiver 302 may be enabled to receive FM signals at a particular frequency $f_1$. The DDFS 312 may be enabled to receive the generated clock signal $f_{LO}$ from the PLL 308 and generate a signal having a frequency $\Delta f$ to the DAC 316, where $\Delta f$ may be defined as $$\Delta f = f_2 - f_1$$

where $f_2$ is the frequency of simultaneous transmission of FM data by the FM transmitter 303. In accordance with an embodiment of the invention, the DDFS 312 may be enabled to modulate the FM data by shifting the center frequency to $\Delta f$, where $\Delta f = f_2 - f_1$. The DDFS 312 may receive a frequency control word, $f_{word}$, from the processor 314 to enable modulation of the FM data. In another embodiment of the invention, the DDFS 312 may be enabled to receive the generated clock signal $f_{LO}$ from the PLL 308 and generate a signal having a frequency $\Delta f$ to the DAC 316, where $\Delta f$ may be defined as $$\Delta f = f_1 - f_2$$

where $f_2$ is the frequency of simultaneous transmission of FM data by the FM transmitter 303. In accordance with another embodiment of the invention, the DDFS 312 may be enabled to modulate the FM data by shifting the center frequency to $\Delta f$, where $\Delta f = f_1 - f_2$. The DDFS 312 may receive a frequency control word, $f_{word}$, from the processor 314 to enable modulation of the FM data. The DDFS 312 may be enabled to generate the output signal having a frequency $\Delta f$ by modifying the frequency $f_1$ of the received FM signal based on the received frequency control word $f_{word}$ from the processor 314.

The DAC 316 may comprise suitable logic, circuitry and/or code that may enable generation of an analog output signal based on a received sequence of input binary numbers from the DDFS 312. The DAC 316 may be enabled to generate a corresponding analog voltage level for each input binary number. The number of distinct analog voltage levels may be equal to the number of distinct binary numbers in the input sequence.

The filter 318 may comprise suitable logic, circuitry and/or code that may enable low pass filtering (LPF) of signal components contained in a received input signal. The filter 318 may enable smoothing of the received input signal to attenuate amplitudes for undesirable frequency components contained in the received input signal. The filter 318 may generate a filtered signal having a frequency $\Delta f$. The filtered signal having a frequency $\Delta f$ may have an I component $\Delta f_I$ and a Q component $\Delta f_Q$. The I component of the filtered signal $\Delta f_I$ may be communicated to the mixer 320. The Q component of the filtered signal $\Delta f_Q$ may be communicated to the mixer 322.

The mixer 320 may comprise suitable logic, circuitry, and/or code that may be enabled to mix the received input signals from the divider 310 and the filter 318 and generate an output signal to the antenna 304 coupled to the bidirectional coupler 306. For example, the mixer 320 may be enabled to mix the I component $f_{1\_I}$ with the I component $\Delta f_I$ to generate an I component $f_{2\_I}$ of an output signal having a frequency $f_2$.

The mixer 322 may comprise suitable logic, circuitry, and/or code that may be enabled to mix the received input signals from the divider 310 and the filter 318 and generate an output signal to the antenna 304 coupled to the bi-directional coupler 306. For example, the mixer 322 may be enabled to mix the Q component $f_{1\_Q}$ with the Q component $\Delta f_Q$ to generate a Q component $f_{2\_Q}$ of an output signal having a frequency $f_2$.

In an exemplary embodiment of the invention, the FM transmitter 303 and the FM receiver 302 may be coupled to the antenna 304 via the bidirectional coupler 306 for simultaneous transmission and/or reception of FM signals. The bi-directional coupler 306 may couple the antenna 304 to the FM receiver 302 at a given time instant, such that the FM receiver 302 may receive signals via the antenna 304 at a particular frequency f1. The bi-directional coupler 306 may couple the antenna 304 to the FM transmitter 303 at the same time instant under the control of a frequency control word $f_{word}$ generated by the processor 314. The DDFS 312 may be enabled to generate the output signal having a frequency $\Delta f$ by modifying the frequency f1 of the received FM signal based on the received frequency control word $f_{word}$ from the processor 314.

Figure 4:
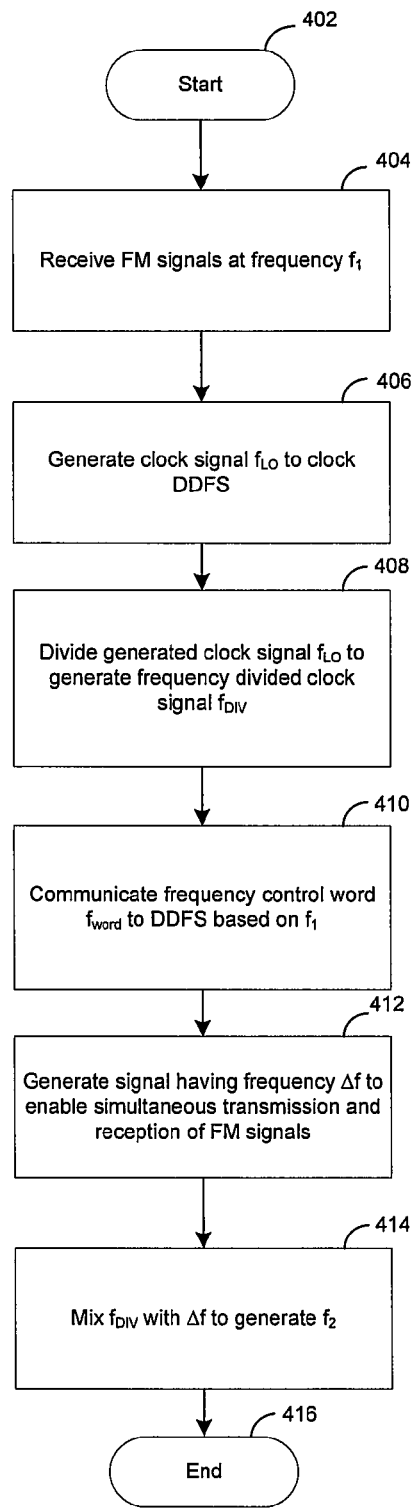
FIG. 4 is a flowchart illustrating exemplary steps for simultaneous FM transmission and FM reception using a shared antenna and a DDFS, in accordance with an embodiment of the invention.

FIG. 4 is a flowchart illustrating exemplary steps for simultaneous FM transmission and FM reception using a shared antenna and a DDFS, in accordance with an embodiment of the invention. Referring to FIG. 4, control steps may begin at step 402. In step 404, the FM receiver may be enabled to receive the FM signals at a frequency $f_1$ via a shared antenna. In step 406, the PLL may generate a clock signal $f_{LO}$ to clock the DDFS. In step 408, the generated clock signal $f_{LO}$ may be divided to generate a frequency divided clock signal $f_{DIV}$, which may be utilized to clock the FM receiver and FM transmitter. The frequency divided clock signal $f_{DIV}$ may have an I component $f_{DIV\_I}$ and a Q component $f_{DIV\_Q}$. In step 410, the processor may communicate a frequency control word $f_{word}$ to the DDFS based on the frequency of the received FM signals $f_1$. In step 412, the DDFS may generate a signal having a frequency $\Delta f$ corresponding to a difference between $f_1$ and $f_2$ to enable simultaneous transmission and reception of FM signals via the shared antenna, where $f_1$ is equal to the frequency of the received FM signals and $f_2$ is the frequency of the transmitted FM signals. In step 414, the frequency divided clock signal $f_{DIV}$ may be mixed with the signal having frequency $\Delta f$ generated via the DDFS to generate a FM transmission signal at frequency $f_2$. Control then passes to end step 416.

In accordance with an embodiment of the invention, a method and system for simultaneous FM transmission and FM reception using a shared antenna and a direct digital frequency synthesizer (DDFS) may be disclosed. In a FM transceiver 202 that receives FM signals at a frequency $f_1$ and transmits FM signals at a frequency $f_2$, the DDFS 312 may be enabled to generate a signal having a frequency $\Delta f$ corresponding to a difference between $f_1$ and $f_2$ to enable simultaneous transmission and reception of FM signals via the shared antenna 304.

The PLL 308 may be enabled to generate a clock signal $f_{LO}$ that may be utilized to enable clocking of the DDFS 312. The divider 310 may enable division of the generated clock signal $f_{LO}$ to generate a frequency divided clock signal $f_{DIV}$, which is utilized for the clocking of the DDFS 312. The frequency divided clock signal $f_{DIV}$ may have a frequency equal to the frequency of the received FM signals $f_1$. The frequency divided clock signal $f_{DIV}$ may comprise an in phase (I) component $f_{DIV\_I}$ and a quadrature phase (Q) component $f_{DIV\_Q}$. The signal having frequency Δf generated via the DDFS 312 may comprise an in phase (I) component $Δf_I$ and a quadrature phase (Q) component $Δf_Q$. The I component of the signal $Δf_I$ may be communicated to the mixer 320. The Q component of the signal $Δf_Q$ may be communicated to the mixer 322. The plurality of mixers 320 and 322 may be enabled to mix the frequency divided clock signal $f_{DIV}$ with the signal having frequency Δf generated via the DDFS 312 to generate a FM transmission signal at frequency $f_2$. The DDFS 312 may be enabled to generate the signal having a frequency Δf based on a received frequency control word $f_{word}$ from the processor 314. The processor 314 may be enabled to generate the frequency control word $f_{word}$ based on the frequency $f_1$ of the received FM signals. The processor 314 may be enabled to adjust the received frequency control word $f_{word}$ to compensate for changes in the frequency of the received FM signals $f_1$. The bi-directional coupler 306 may be enabled to control the simultaneous transmission and reception of the FM signals. The DDFS 312 may be enabled to modulate the FM signals by shifting the center frequency to Δf, where $Δf=f_1-f_2$ or $Δf=f_2-f_1$.

Another embodiment of the invention may provide a machine-readable storage, having stored thereon, a computer program having at least one code section executable by a machine, thereby causing the machine to perform the steps as described above for simultaneous FM transmission and FM reception using a shared antenna and a direct digital frequency synthesizer (DDFS).

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for communicating signals, the method comprising:
   in a frequency modulation (FM) transceiver that receives FM signals at a frequency $f_1$ and transmits FM signals at a frequency $f_2$, generating utilizing a direct digital frequency synthesizer (DDFS), a signal corresponding to a difference between $f_1$ and $f_2$ to enable simultaneous transmission of said FM signals and reception of said FM signals.

2. The method according to claim 1, comprising clocking said DDFS based on a generated clock signal.

3. The method according to claim 2, comprising dividing said generated clock signal to generate a frequency divided clock signal, which is utilized for said clocking of said DDFS.

4. The method according to claim 3, wherein a frequency of said frequency divided clock signal is equal to frequency $f_1$.

5. The method according to claim 3, comprising mixing said frequency divided clock signal with said signal generated utilizing said DDFS to generate a FM transmission signal at frequency $f_2$.

6. The method according to claim 3, wherein said frequency divided clock signal comprises an in phase (I) component and a quadrature phase (Q) component.

7. The method according to claim 1, wherein said signal generated utilizing said DDFS comprises an in phase (I) component and a quadrature phase (Q) component.

8. The method according to claim 1, comprising generating said signal utilizing said DDFS based on a received frequency control word.

9. The method according to claim 8, comprising adjusting said received frequency control word to compensate for changes in said frequency $f_1$.

10. The method according to claim 1, comprising controlling said simultaneous transmission of said FM signals and said reception of said FM signals utilizing a bi-directional coupler.

11. The method according to claim 1, comprising modulating utilizing said DDFS, said FM signals, by shifting a center frequency corresponding to said difference between $f_1$ and $f_2$.

12. A system for communicating signals, the system comprising:
    one or more circuits in a frequency modulation (FM) transceiver that are operable to receive FM signals at a frequency $f_1$ and are operable to transmit FM signals at a frequency $f_2$; and
    said one or more circuits are operable to generate utilizing a direct digital frequency synthesizer (DDFS), a signal corresponding to a difference between $f_1$ and $f_2$ to enable simultaneous transmission of said FM signals and reception of said FM signals.

13. The system according to claim 12, wherein said one or more circuits are operable to clock said DDFS based on a generated clock signal.

14. The system according to claim 13, wherein said one or more circuits are operable to divide said generated clock signal to generate a frequency divided clock signal, which is utilized for said clocking of said DDFS.

15. The system according to claim 14, wherein a frequency of said frequency divided clock signal is equal to frequency $f_1$.

16. The system according to claim 14, wherein said one or more circuits are operable to mix said frequency divided clock signal with said signal generated utilizing said DDFS to generate a FM transmission signal at frequency $f_2$.

17. The system according to claim 14, wherein said frequency divided clock signal comprises an in phase (I) component and a quadrature phase (Q) component.

18. The system according to claim 12, wherein said signal generated utilizing said DDFS comprises an in phase (I) component and a quadrature phase (Q) component.

19. The system according to claim 12, wherein said one or more circuits are operable to generate said signal utilizing said DDFS based on a received frequency control word.

20. The system according to claim 19, wherein said one or more circuits are operable to adjust said received frequency control word to compensate for changes in said frequency $f_1$.

21. The system according to claim 12, wherein said one or more circuits are operable to control said simultaneous transmission of said FM signals and said reception of said FM signals utilizing a bi-directional coupler.

22. The system according to claim 12, wherein said one or more circuits are operable to modulate utilizing said DDFS, said FM signals, by shifting a center frequency corresponding to said difference between $f_1$ and $f_2$.

* * * * *